United States Patent
Gotoh et al.

(10) Patent No.: US 6,312,860 B1
(45) Date of Patent: Nov. 6, 2001

(54) PHOSPHOR COMPOSITION, PHOSPHOR PASTE, AND PHOTOSENSITIVE DRY FILM

(75) Inventors: Naoki Gotoh; Masaaki Asano, both of Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/172,001

(22) Filed: Oct. 14, 1998

(30) Foreign Application Priority Data

Oct. 15, 1997 (JP) .................................................. 9-296430

(51) Int. Cl.[7] .................................................. G03F 7/075
(52) U.S. Cl. .............................. 430/26; 430/23; 313/486; 313/487; 445/24
(58) Field of Search ................ 430/139, 26, 28, 430/24; 427/64, 67, 68; 445/24; 313/486, 487

(56) References Cited

U.S. PATENT DOCUMENTS

| | | | |
|---|---|---|---|
| 3,700,479 | * 10/1972 | Arents | 427/64 |
| 3,891,886 | * 6/1975 | Woontner | 252/301.4 |
| 3,898,174 | * 8/1975 | Lehmann | 252/301.4 |
| 4,151,442 | * 4/1979 | Koga et al. | 313/467 |
| 4,431,942 | * 2/1984 | Thornton | 313/487 |
| 4,442,377 | * 4/1984 | Higton et al. | 427/64 |
| 6,022,652 | * 2/2000 | Haven et al. | 430/26 |
| 6,025,675 | * 2/2000 | Ihara et al. | 313/467 |

FOREIGN PATENT DOCUMENTS

| | | |
|---|---|---|
| 50-133986 | * 10/1975 | (JP) . |
| 54-100663 | * 8/1979 | (JP) . |
| 55165984 | * 12/1980 | (JP) . |
| 60-147490 | * 8/1985 | (JP) . |
| 61-243884 | * 10/1986 | (JP) . |
| 03-006290 | * 1/1991 | (JP) . |

OTHER PUBLICATIONS

Grum, F. et al., "Optical radiation measurements, vol. 2, Color Measurement" Academic Press, pp. 12, 13 and 80–87, 1980.*

* cited by examiner

*Primary Examiner*—Martin Angebranndt
(74) *Attorney, Agent, or Firm*—Parkhurst & Wendel, L.L.P.

(57) ABSTRACT

Disclosed are a phosphor composition comprising an inorganic phosphor, capable of emitting blue color upon ultraviolet irradiation, and copper or a copper compound; a phosphor paste comprising the phosphor composition dispersed in a dispersing medium; and a photosensitive dry film formed from the phosphor paste.

9 Claims, 1 Drawing Sheet

PHOSPHOR COMPOSITION, PHOSPHOR PASTE, AND PHOTOSENSITIVE DRY FILM

BACKGROUND OF THE INVENTION

1. Technical Field of the Invention

The present invention relates to a phosphor composition, a phosphor paste, and a photosensitive dry film. More particularly, the present invention relates to a phosphor composition comprising a blue-emitting inorganic phosphor, which, when used in the formation of a phosphor layer in a plasma display panel (PPD.), can solve a problem of lowered brightness involved in the phosphor layer, a phosphor paste comprising the composition, and a photosensitive dry film formed from the paste.

2. Background Art

In general, PPD. Comprises two opposed glass substrates, a pair of electrodes systematically arranged in the glass substrates, and a gas (mainly neon or the like) sealed therebetween. A voltage is applied across the electrodes to produce discharge within minute cells around the electrodes to emit light from each cell, thereby displaying information. Systematically arranged cells are selectively subjected to discharge luminescence in order to display information. Such PAPS are classified into two types; a direct current type PPD., wherein electrodes are exposed to a discharge space (DC type), and an alternating current type (AC type) wherein electrodes are covered with an insulating layer. Each of these types is further classified into a refresh drive system and a memory drive system according to display functions and drive systems.

FIG. 1 is an embodiment of the construction of an AC type PPD. In the drawing, a front plate 11 and a back plate 12 are shown separately from each other. As shown in the drawing, the glass front plate 11 and the back plate 12 are arranged parallel and opposite to each other. Barrier ribs 13 are provided so as to stand in a fixed state on the back plate 12 in its front surface side, and the front plate 11 and the back plate 12 are held while leaving a given distance between the front plate 11 and the back plate 12 by means of the barrier ribs 13. Composite electrodes each comprising a sustaining electrode 14 as a transparent electrode and a bus electrode 15 as a metallic electrode are provided parallel to each other on the front plate 11 in its back plate side, and a dielectric layer 16 is provided so as to cover the composite electrode. Further, a protective layer 17 (MgSO layer) is provided on the surface of the dielectric layer 16.

On the other hand, address electrodes 18 are provided between the barrier ribs 13 on the back plate 12 in its front surface side so that the address electrodes 18 are parallel to each other and orthogonal to the composite electrodes. Further, a phosphor layer 19 is provided so as to cover the wall surface of the barrier ribs 13 and the bottom face of cells.

In the AC type PPD., a predetermined voltage is applied, from an alternating-current power supply, across the composite electrodes on the front plate 11 to create an electric field, thereby producing discharge in each cell as a display element defined by the front plate 11, the back plate 12, and the barrier ribs 13. Ultraviolet light produced by the discharge permits the phosphor layer 19 to emit light, and light passed through the front plate 11 is viewed by an observer.

Methods for coating the phosphor layer proposed in the art include (1) printing a phosphor-containing paste by silk screen and baking the print, (2) rendering the phosphor paste photosensitive and forming the phosphor layer from the phosphor paste by photolithography, and (3) a photoresist film of a photosensitive resin composition.

In all the above methods, firing at a temperature suitable for avoiding the occurrence of a residue of any organic material in the final phosphor layer is carried out to form a phosphor layer. This firing step poses a problem of lowered sensitivity (brightness) of phosphor. This problem more or less occurs in any phosphor of red, green, and blue. This tendency is particularly significant for the blue phosphor, especially when the phosphor layer is formed by photolithography. Consequently, a PPD. Back plate having satisfactory properties cannot be provided.

Accordingly, it is an object of the present invention to provide a blue phosphor composition, a phosphor paste, and a photosensitive dry film that can solve the above problems of the prior art and can yield a phosphor layer that causes no significant lowering in brightness upon firing.

SUMMARY OF THE INVENTION

In order to attain the above objects, according to the present invention, there is provided a phosphor composition comprising an inorganic phosphor, capable of emitting blue color upon ultraviolet irradiation; and copper or a copper compound. There is further provided a phosphor paste comprising the phosphor composition dispersed in a dispersing medium. There is still further provided a photosensitive dry film formed from the phosphor paste.

The phosphor paste and the photosensitive dry film according to the present invention cause no significant lowering in brightness upon firing and hence can be advantageously used as a phosphor layer in the back plate of PPD.

DETAILED DESCRIPTION OF THE INVENTION

Figure 1:
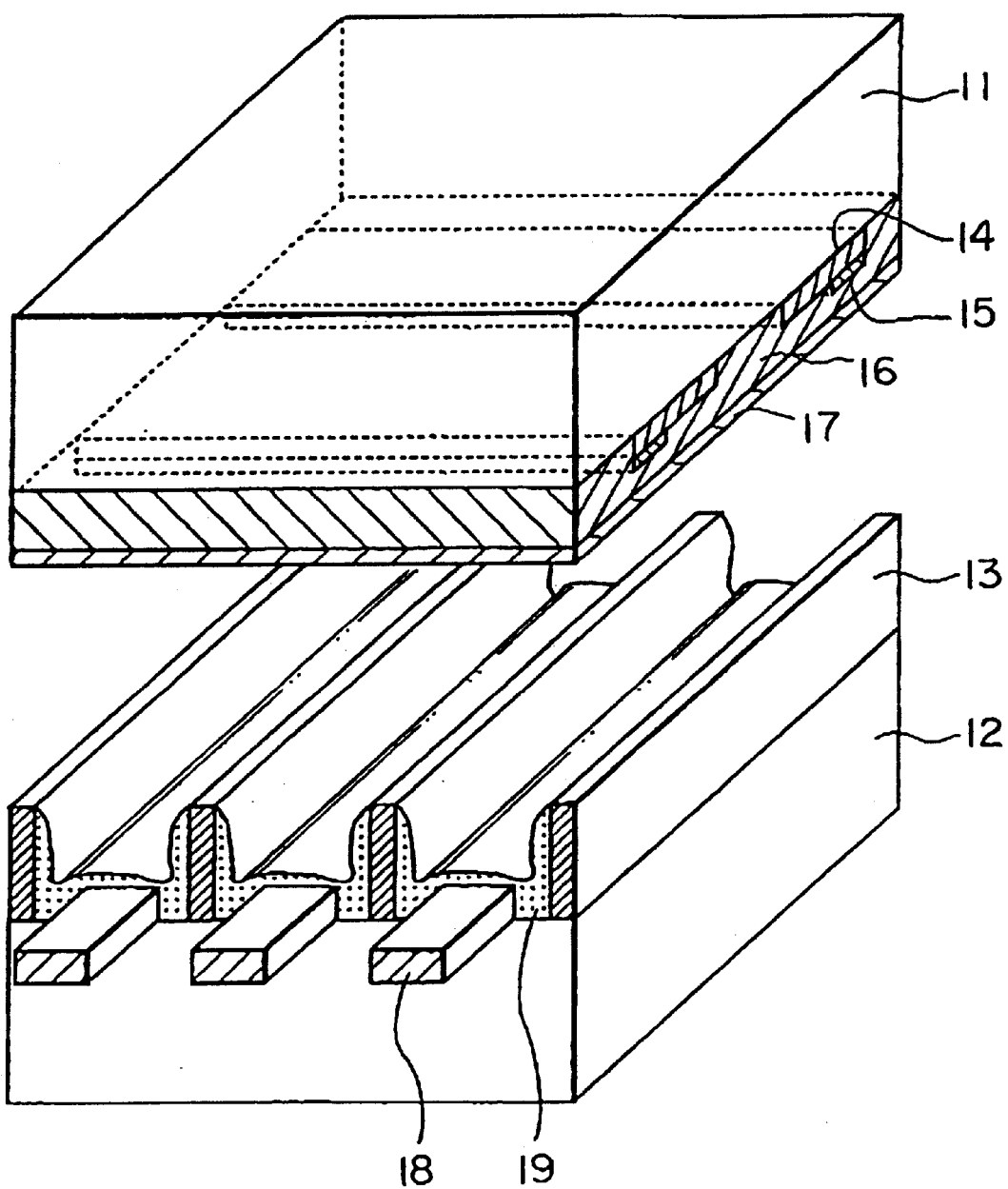
FIG. 1 is a diagram showing an embodiment of the construction of a plasma display panel.

The present invention will be described in more detail with reference to the following preferred embodiments.

The blue-emitting phosphor per se used in the phosphor composition of the present invention is a conventional blue-emitting phosphor. Example of blue-emitting phosphors usable herein include ZnS:Ag+red pigment, $Y_2SiO_3$:Ce, $CgWO_4$:Pb, $Y_2SiO_5$:Ce, $YP_{0.85}V_{0.15}O_4$, ZnS:(Ag,CD), and BaMg-aluminate:Eu, such as $BaMgAl_{14}O_{23}$:Eu, $BaMAl_{16}O_{27}$:Eu, $BaMg_2Al_{14}O_{23}$:Eu, $BaMg_2Al_{14}O_{27}$:Eu, and $BaMgAl_{10}O_{17}$:Eu. At least one of these phosphors is used.

According to the present invention, copper or a copper compound is incorporated into the phosphor. A fine copper powder may be used as copper. Copper compounds usable herein include, for example, inorganic acid salts of copper, such as copper nitrate, copper sulfate, and copper chloride, organic acid salts of copper, such as copper formate, copper acetate, and copper propionate, and organometal compounds of copper, such as copper alkoxides. These copper and copper compounds may be generally used in an amount of 0.0001 to 1 part by weight, preferably 0.005 to 0.1 part by weight, based on 100 parts by weight of the blue phosphor. When the proportion of the copper or copper compound incorporated is below the lower limit of the above range, it is difficult to inhibit the lowering of the brightness of the blue phosphor. On the other hand, incorporation of the copper or copper compound in a proportion above the upper limit of the above range poses deteriorated brightness and other problems due to coloring. The copper or copper compound may be incorporated into the phosphor by any method. Examples of methods usable herein include a method wherein a phosphor powder and a powder of copper or a copper compound are mixed together, a method wherein a phosphor powder is mixed in a solution or dispersion of copper a copper compounds, a method wherein a solution or dispersion of copper or a copper compound is added to a phosphor powder, and a method wherein a phosphor and copper or a copper compound are mixed in a photosensitive resin liquid.

The phosphor paste of the present invention may be prepared by dispersing the phosphor composition of the present invention in a suitable dispersing medium. Examples of preferred dispersing media usable herein include varnish for screen printing and photosensitive resin liquids.

The varnish for screen printing may be prepared by dissolving a non photosensitive binder resin in a suitable organic solvent. A preferred varnish is such that a phosphor paste prepared using the varnish has a viscosity of about 10 to 1000 poises, preferably 100 to 400 poises. The binder may be any conventional binder for screen printing inks. A preferred binder is such a resin that the organic component is satisfactorily burned off in the firing involved in the production of PPD. Panels. Examples thereof include acrylic resin, polyester resin, and vinyl resin. Examples of particularly preferred binder resins include cellulose derivatives, such as ethylcellulose, hydroxyethylcellulose, ethylhydroxethylcellulose, hydroxypropylcellulose, methylcellulose, and cellulose acetate butyrate. These binder resins may be used alone or as a mixture of two or more.

The amount of the binder resin used is preferably about 2 to 45 parts by weight based on 100 parts by weight of the phosphor composition. When the amount of the binder used is below the lower limit of the above range, the suitability for coating of the ink, the strength of coatings and other properties are unsatisfactory. On the other hand, when the amount of the binder used is above the upper limit of the above range, problems unfavorably occur, in the later step of firing, including coloration and cracking of a phosphor face due to unsatisfactory firing.

Any organic solvent commonly used in conventional screen printing inks may be used as the organic solvent Examples of organic solvents usable herein include: alcoholic solvents, for example, di alkylene glycol monoalkyl ether acetates, such as diethylene glycol monomethyl ether acetate and diethylene glycol monoethyl ether acetate, di alkylene glycol monoalkyl ethers, such as diethylene glycol monomethyl ether and diethylene glycol monoethyl ether, isopropyl alcohol, butanol, and isobutanol; ketone solvents, such as methyl ethyl ketone, methyl isobutyl ketone, and cyclohexanone; aromatic solvents, such as toluene and xylene; halogenated solvents, such as dichloromethane and trichloroethane; and ether solvents, such as dioxane and tetrahydrofuran. They may be used alone or as a mixture of two or more. The amount of the organic solvent used is such that the viscosity (25° C.) Is about 50 to 3000 poises which is suitable for silk screen printing of the paste.

The content of the inorganic material on a solid basis in the phosphor paste thus obtained is generally about 45 to 97% by weight based on the total amount of the paste. The content of the organic material on a solid basis of the phosphor paste is generally about 3 to 55% by weight based on the total amount of the paste.

When the phosphor paste of the present invention is photosensitive, the phosphor composition is added to, mixed with, dispersed in the photosensitive resin liquid in the same manner as described above, and adjusted to a suitable viscosity.

The photosensitive resin liquid to be used in the present invention may be any conventional photosensitive resin. A preferred example of the photosensitive resin comprises (a) a base polymer, (b) an ethylenically unsaturated compound, and (c) a photopolymerization initiator. Examples of the base polymer (a) usable herein include acrylic resin, polyester resin, and polyurethane resin. Among them, an acrylic copolymer is preferred which is composed mainly of a (meth)acrylic ester and, if necessary, is copolymerized with an ethylenically unsaturated carboxylic acid or other copolymerizable monomer(s). Acetoacetyl-containing acrylic copolymers may also be used.

(Meth)acrylic esters usable herein include methyl (meth)acrylate, ethyl (meth)acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, dimethylaminoethyl (meth)acrylate, hydroxyethyl (meth)acrylate, hydroxypropyl (meth)acrylate, and glycidyl (meth)acrylate.

Suitable ethylenically unsaturated carboxylic acids include monocarboxylic acids, such as acrylic acid, methacrylic acid, and crotonic acid. In addition, dicarboxylic acids, such as maleic acid, fumaric acid, and itaconic acid, and anhydrides and half esters thereof may also be used. Among them, acrylic acid and methacrylic acid are particularly preferred. When the photosensitive resin composition is brought to a dilute alkali developable type, copolymerization of about 15 to 30% by weight (an amount suitable to provide an acid value of about 100 to 200 mg KOH/g) of an ethylenically unsaturated carboxylic acid is necessary.

Other copolymerizable monomers usable herein include acrylamide, methacrylamide, acrylonitrile, methacrylonitrile, styrene, α-methylstyrene, vinyl acetate, and alkyl vinyl ethers.

Ethylenically unsaturated compounds (b) usable herein include polyfunctional monomers, such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerin di(meth)acrylate, pentaerythritol di(meth)acrylate, pentaerythritol tri(meth)acrylate, dipentaaerythritol penta(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phathalic acid diglycidyl ester di(meth)acrylate, and glycerin polyglycidyl ether poly(meth)acrylate. These polyfunctional monomers may be used in a suitable amount in combination with monofunctional monomers.

Examples of monofunctional monomers usable herein include 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, 2-(meth)acryloyloxyethyl phosphate, half (meth)acrylate of phthalic acid derivatives, and N-methylol (meth)acrylamide.

The proportion of the ethylenically unsaturated compound (b) based on 100 parts by weight of the base polymer (a) is preferably 10 to 200 parts by weight, particularly preferably 40 to 100 parts by weight. When the amount of the ethylenically unsaturated compound (b) is below the lower limit of the above range, unsatisfactory curing of the photosensitive composition, lowered flexibility of the photosensitive composition layer, and lowered development rate of the photosensitive composition layer occur. On the other hand, an amount of the ethylenically unsaturated compound (b) above the upper limit of the above range unfavorably causes increased adhesion of the composition, cold flow, and lowered peel rate of the cured resist.

Photopolymerization initiators (c) usable herein include benzoin, benzoin methyl ether, benzoin ethyl ether, benzoin isopropyl ether, benzoin n-butyl ether, benzoin phenyl ether, benzyl diphenyl disulfide, benzyl dimethyl ketal, dibenzyl, diacetyl, anthraquinone, naphthoquinone, 3,3'-dimethyl-4-methoxybenzophenone, benzophenone, p,p'-bis(dimethylamino)benzophenone, p,p'-bis(diethylamino) benzophenone, p,p'-diethylaminobenzophenone, pivaloin ethyl ether, 1,1-dichloroacetophenone, p-t-butyldichloroacetophenone, hexaaylimidazole dimer, 2,2'-bis(o-chlorophenyl)-4,5,4', 5'-tetraphenyl-1,2'-biimidazole, 2-chlorothioxanthone, 2-methylthioxanthone, 2,4-diethylthioxanthone, 2,2'-diethoxyacetophenone, 2,2'-dimethoxy-2-phenyl acetophenone, 2,2'-dichloro-4phenoxyacetophenone, phenyl glyoxylate, α-hydroxyisobutylphenone, dibenzosparon, 1-(4isopropylphenyl)-2-hydroxy-2-methyl-1-propanone, 2-methyl-[4(methylthio)phenyl]-2-morpholino-1-propanone, tribromophenylsulfone, and tribromomethylphenylsulfone. In this case, the total proportion of the photopolymerization initiator (c) incorporated is suitably about 1 to 20 parts by weight based on 100 parts by weight in total of the base polymer (a) and the ethylenically unsaturated compound (b).

The content on a solid basis of the inorganic material in the photosensitive phosphor paste is generally about 20 to 60% by weight based on the total amount of the paste. The content on a solid basis of the organic material in the photosensitive phosphor paste is generally about 1 to 30% by weight based on the total amount of the paste.

The photosensitive dry film of the present invention may be formed by coating the photosensitive phosphor paste onto a suitable substrate film of polyethylene terephthalate, polypropylene or the like and drying the coating. The thickness of the photosensitive phosphor layer is preferably in the range of about 10 to 100 μm.

The dry film of the present invention may be formed in this way. According to a preferred embodiment of the present invention, in order to facilitate pressing (transfer) of the phosphor-containing layer into the back substrate of PPD, a pressure sensitive adhesive layer may be provided on the surface of the phosphor-containing layer. Further, the same film as used as the substrate film may also be applied as a protective layer onto the surface of the phosphor-containing layer or the pressure sensitive adhesive layer from the viewpoint of improving the storage stability of the dry film. In use, the protective layer is separated, and the phosphor-containing layer is transferred onto the surface of the back substrate of PPD.

The phosphor composition, the phosphor paste, and the phosphor layer for the back plate of PPD. using the photosensitive dry film according to the present invention may be formed by any conventional method and are not particularly limited.

The following examples and comparative examples further illustrate the present invention. In the examples, "%" or "parts" is by weight unless otherwise specified.

Examples 1 to 4 and Comparative Example 1

The following components were mixed and dispersed together to prepare a photosensitive phosphor paste of the present invention. the copper compound used and the amount of the copper compound used are shown in Table 1.

| | |
|---|---|
| Phosphor (blue phosphor for PDP, tradename KX-501A, chemical compostion of phosphor $BaMgAl_{10}O_{17}$: Eu, manufactured by Kasei Optonix, Ltd.) | 52.0 parts |
| Methylcellulose | 5.7 parts |
| Dipentaerythritol hexaacrylate | 7.5 parts |
| Trimethylolpropane triacrylate | 7.5 parts |
| 3-Methoxy-3-methyl-1-butanol | 32.8 parts |
| Polymerization initiator (Irgacure 907) | 2.0 parts |
| Polymerization initiator (Kayacure DEPX-S) | 1.0 parts |
| Copper compound (see Table 1) | X parts |

The paste had a viscosity of about 200 poises at 25° C.

TABLE 1

| Example No. | Copper compound | Amount added, ppm |
|---|---|---|
| Example 1 | Copper nitrate | 5 |
| Example 2 | Copper nitrate | 10 |
| Example 3 | Copper nitrate | 30 |
| Example 4 | Copper nitrate | 50 |
| Comparative Example 1 | Not used | — |

Each of the phosphor pastes thus obtained was coated by means of a blade coater onto the surface of an untreated glass at a coverage of 20 to 30 μm on a dry basis, and the coating was dried at 80° C. for 30 min, exposed and cured (exposure 400 mJ/cm$^2$). The phosphor layers each were fired at a temperature of 450° C. for 30 min, followed by cooling to prepare samples. The brightness of the samples was evaluated by the following method.

Evaluation Method

Vacuum ultraviolet light at a wavelength of 146 nm was applied to each sample from an excimer beam emitting lamp within a vacuum chamber, and the brightness and the chromaticity of each sample were determined by measuring light, emitted from each sample, whit a spectrophotometer. Specifically, a reference sample and the sample were set in the chamber, the chamber was evacuated by means of a rotary pump and then purged with a high purity nitrogen gas for 15 min, followed by measurement of the brightness and the chromaticity. The measurement was carried out in the order of reference sample, samples of examples and comparative examples, and reference sample. The excimer beam irradiation apparatus used was UER20H-126 manufactured by Ushio Inc., and SR-1 manufactured by Topcon Corp. was used as the spectrophotometer. The results of the measurement are shown in Table 2. The reference sample used was a phosphor per se without addition of the copper compound (blue phosphor for PPD., tradename KX-501A, chemical composition of phosphor $BaMgAl_{10}O_{18}$:Eu, manufactured by Kasei Optonix, Ltd.). Brightness values indicated in the table each are a relative value determined by presuming a value, obtained by dividing the brightness of the reference sample by the chromaticity y, as 100.

TABLE 2

| Example No. | Brightness |
|---|---|
| Example 1 | 59.8 |
| Example 2 | 63.5 |
| Example 3 | 66.6 |
| Example 4 | 68.4 |
| Comparative Example 1 | 57.9 |

Example 5 to 8 and Comparative Example 2

The following components were mixed and dispersed together to prepare a non photosensitive phosphor paste of the present invention. The copper compound used and the amount of the copper compound used are shown in Table 3.

| | |
|---|---|
| Phosphor (blue phosphor for PDP, tradename KX-501A of phosphor, chemical mosifion $BaMgAl_{10}O_{17}$: Eu, manufactured by Kasei Optonix, Ltd.) | 50.0 parts |
| Ethylcellulose | 5.0 parts |
| Diethylene glycol monobutyl ether acetate | 45.0 parts |
| Copper compound (see Table 3) | X parts |

The paste had a viscosity of about 200 to 300 poises at 25° C.

TABLE 3

| Example No. | Copper compound | Amount added, ppm |
|---|---|---|
| Example 5 | Copper nitrate | 5 |
| Example 6 | Copper nitrate | 10 |
| Example 7 | Copper nitrate | 30 |
| Example 8 | Copper nitrate | 50 |
| Comparative Example 2 | Not used | — |

Each of the phosphor pastes thus obtained was coated by means of a blade coater onto the surface of an untreated glass at a coverage of 20 to 30 μm on a dry basis, and the coating was dried at 120° C. for 30 min to cure the coating. The phosphor layers each were fired at a temperature of 450° C. for 30 min (peak temperature 495° C.), followed by cooling to prepare samples. The brightness of the samples was evaluated. The evaluation method and the reference sample were the same as described above. The results are shown in Table 4.

TABLE 4

| Example No. | Brightness |
|---|---|
| Example 5 | 84 |
| Example 6 | 87 |
| Example 7 | 90 |
| Example 8 | 93 |
| Comparative Example 2 | 82 |

Example 9 to 13 and Comparative Example 3

The following components were mixed and dispersed together to prepare a photosensitive phosphor composition of the present invention. The copper compound used and the amount of the copper compound used are shown in Table 5.

| | |
|---|---|
| Phosphor (blue phosphor for PDP, tradename NP-107, chemical composition of phosphor $BaMgAl_{10}O_{17}$: Eu, manufactured by Nichia Chemical Industries, Ltd.) | 63.0 parts |
| Base polymer specified below | 11.0 parts |
| Ethylenycally unsaturated compound specifed below | 13.0 parts |
| Photopolymerizafion initiator specified below | 2.0 parts |
| Dioctyl phthalate | 10.0 parts |
| Copper compound (see Table 5) | X parts |

Base Polymer

Copolymer of methyl methacrylate/n-butyl methacrylate/2-ethylhexyl acrylate/methacrylic acid in a comonomer weight ratio of 55/8/15/22 (acid value 143.3, glass transition temp. 66.3° C., weight average molecular weight 80,000)

Ethylenically Unsaturated Compound

Mixture of trimethylolpropane triacrylate/polyethylene glycol (600) dimethacrylate/ethylene oxide-modified phthalic acid acrylate (manufactured by Kyoeisha Chemical Co., Ltd.) in a weight ratio of 20/10/6

Photopolymerzation Initiator

Mixture of benzophenone/p,p'-diethylaminobenzophenone/2,2'-bis(o-chlorophenyl) 4,5,4',5'-tetraphenyl-1,2'-biimidazole in a weight ratio of 8/0.15/1

TABLE 5

| Example No. | Copper compound | Amount added, ppm |
|---|---|---|
| Example 9 | Copper nitrate | 5 |
| Example 10 | Copper nitrate | 10 |
| Example 11 | Copper nitrate | 30 |
| Example 12 | Copper nitrate | 50 |
| Example 13 | Copper nitrate | 100 |
| Comparative Example 2 | Not used | — |

Preparation of Dry Films

The above photosensitive compositions each were coated onto a 20 μm-thick polyester film by means of a blade coater. The coatings were allowed to stand at room temperature for 1.5 min, and dried in an oven at 90° C. for 30 min. Thus, dry films, with a photosensitive composition layer thickness of 30 μm, according to the present invention were prepared. In this dry films, no protective film was provided).

Lamination onto Glass Substrate

This dry films each were laminated onto an untreated glass substrate, which had been preheated at 60° C. in an oven, under conditions of laminating roll temperature 100° C., laminating roll pressure 3 kg/cm², and lamination speed 1.5 m/min. The laminates were then exposed at an exposure of 400 mJ/cm² and cured. The phosphor layers were fired at a temperature of 550° C. for 30 min, followed by cooling to prepare samples. The brightness of the samples was evaluated. The results are shown in Table 6. The evaluation method and the reference sample were the same as described above.

TABLE 6

| Example No. | Brightness |
|---|---|
| Example 9 | 76 |
| Example 10 | 80 |
| Example 11 | 85 |
| Example 12 | 90 |
| Example 13 | 82 |
| Comparative Example 3 | 74 |

What is claimed is:

1. A phosphor paste for forming a phosphor layer in a color plasma display panel by firing a phosphor paste layer, said phosphor paste comprising a phosphor composition dispersed in a dispersing medium, the phosphors composition capable of emitting blue color after firing upon ultraviolet radiation, said phosphor composition comprising a mixture of (1) an inorganic phosphor used in a plasma display panel and capable of emitting blue color upon ultraviolet irradiation and (2) copper or a copper compound with no deterioration in the brightness or variation in the coloration of the phosphor.

2. The phosphor paste according to claim 1, wherein the inorganic phosphor is at least one member selected from the group consisting of ZENS:Bag+red pigment, $Y_2SiO_3$:Ce, $CaW_4$:Pb, $Y_2SiO_5$:Ce, $YP_{0.85}V_{0.15}O_4$ZeNS:(Ag,Cd), $BaMgAl_{14}O_{23}$:Eu, $BaMgAl_{16}O_{27}$:Eu, $BaMg_2Al_{14}O_{23}$:Eu, $BaMg_2Al_{14}O_{27}$:Eu, and $BaMgAl_{10}O_{17}$:Eu.

3. The phosphor paste according to claim 1, wherein the copper compound is a member selected from inorganic acid salts, organic acid salts, or organometal compounds of copper.

4. The phosphor paste according to claim 1, wherein the copper or copper compound is contained in an amount of 0.0001 to 1 part by weight per 100 parts by weight of the inorganic phosphor.

5. The phosphor paste according to claim 1, wherein the dispersing medium comprises a non photosensitive resin.

6. The phosphor paste according to claim 1, wherein the dispersing medium comprises a photosensitive resin.

7. A photosensitive dry film formed from a phosphor paste according to claim 6.

8. A plasma display panel comprising a phosphor layer formed from the photosensitive dry film according to claim 7.

9. A plasma display panel comprising a phosphor layer formed from the phosphor paste according to claim 1.

* * * * *